United States Patent
Naura et al.

(10) Patent No.: US 6,212,112 B1
(45) Date of Patent: Apr. 3, 2001

(54) METHOD TO VERIFY THE INTEGRITY OF THE DECODING CIRCUITS OF A MEMORY

(75) Inventors: David Naura; Frederic Moncada, both of Aix-en-Provence (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/452,446

(22) Filed: Dec. 2, 1999

(30) Foreign Application Priority Data

Dec. 11, 1998 (FR) .................................................. 98 15786

(51) Int. Cl.⁷ .............................. G11C 7/00; G01R 31/28
(52) U.S. Cl. ...................... 365/201; 365/238.5; 714/718; 714/719
(58) Field of Search .............................. 365/201, 230.06, 365/238.5; 714/718, 719, 720

(56) References Cited

U.S. PATENT DOCUMENTS

| | | | | |
|---|---|---|---|---|
| 5,481,499 | * | 1/1996 | Meyer ................................... | 365/201 |
| 5,490,115 | * | 2/1996 | Shah et al. ............................ | 365/201 |
| 5,954,831 | * | 9/1999 | Chang et al. ......................... | 365/201 |
| 5,996,106 | * | 11/1999 | Seyyedy ............................... | 714/763 |

OTHER PUBLICATIONS

"High Coverage Three–Pattern Dram Test" IBM Technical Disclosure Bulletin, vol. 36, No. 2, Feb. 1, 1993, pp. 225–228, ISSN: 0018–8689.

Van De Goor et al.: "Locating Bridging Faults in Memory Arrays" Proceedings of the International Test Conference, Nashville, Oct. 28–30, 1991, Jan. 1, 1991,pp. 685–694, IEEE ISBN: 0–8186–9156–5.

Bappert et al.: "Memory Testing", IBM Technical Disclosure Bulletin, vol. 19, No. 5, Oct. 1976, p. 1621 XP002116220, IBM Corp. New York.

\* cited by examiner

*Primary Examiner*—Son Mai
(74) *Attorney, Agent, or Firm*—Theodore G. Galanthay; Allen, Dyer Doppelt, Milbrath & Gilchrist, P.A.

(57) ABSTRACT

A method for testing decoding circuits in a memory including a matrix of storage cells includes writing the same first word in all the storage cells, and then writing second words in the matrix such that each row and each column has at least one stored second word. The second words are different from the first words. If several second words are written in the same row or in the same column, then the second words are different from one another. Reading all the words in the memory permits verification of the integrity of the decoding circuits, and reduces the testing time of the memory.

34 Claims, 3 Drawing Sheets

METHOD TO VERIFY THE INTEGRITY OF THE DECODING CIRCUITS OF A MEMORY

FIELD OF THE INVENTION

The invention relates to a method for verifying the integrity of decoding circuits of a memory, and, more particularly, to a diagonal test performed during production testing of the memory.

BACKGROUND OF THE INVENTION

An important step during the manufacture of an integrated circuit is to verify operation of the circuit at the end of production. Given the number and size of transistors formed in an integrated circuit, it is not rare for an impurity to be deposited either on a manufacturing mask or on the silicon wafer during manufacture, thus causing an error in the circuit. These errors are expressed in different ways, such as a connection fault, a short-circuit or a defective transistor. In general, signals are said to be either stuck between two signals or, more generally, stuck at a logic level 1 or 0.

The integration density in a memory is typically at a maximum and the risk of a signal being stuck is thereby increased. Many tests have been prepared for carrying out individual tests on all the functional elements of the memory. Since the testing time has to be reduced for cost reasons, the fastest tests are carried out for enabling detection of a maximum number of errors so that the total tests are performed only on the valid components.

One of the first tests performed on a memory includes verifying the integrity of the storage matrix. Testing the integrity of the storage matrix is one of the shortest tests and, therefor, enables the defective components to be sorted out faster. However, the other elements of the memory must also be tested. This makes it possible to carry out the other tests while assuming the storage matrix works properly.

To ascertain the integrity of the decoding circuits, there are known methods in the prior art for carrying out the test of the diagonal, hereinafter referred to as the diagonal test. The diagonal test includes placing all the storage cells in a first state. Then, all the storage cells located on the diagonal of the storage matrix are placed in a second state. FIG. 1 shows a square type matrix 1 having storage cells 2. The contents of the storage cells 2 are indicated on each cell. All these cells contain a logical level 0 except for the cells of the diagonal of the matrix 1, which contains a logic level 1.

The diagonal test ends with a reading of each storage cell to ascertain that there is no multiple decoding of rows or columns. A multiple decoding results in an erroneous reading of the contents of certain cells. When an error occurs during the writing, two bits or no bits are written simultaneously instead of a single bit for converting a 0 into 1, or vice versa. Similarly, when a decoding error occurs during the reading, several cells are read simultaneously and the information read is the result of an AND or OR logic function between the data that is simultaneously read. The logic function is dependent on the type of memory and/or on the error.

The diagonal test is very efficient for a square storage matrix, i.e., a matrix having as many rows (word lines) as columns (bit lines). However, it is common to have rectangular storage matrices, wherein the number of rows and columns are different. Referring to page access memories, the corresponding memory has 512 columns regardless of its total capacity. Conventionally, a page has 64 eight-bit words. The diagonal test then takes the form shown in FIGS. 2 and 3. The rectangular matrix is divided into several square matrices.

As readily understood by one skilled in the art when referring to FIGS. 2 and 3, the patterns written are repeated for different addresses. This is all the more troublesome as the pattern is repeated for addresses where only one bit changes. It is therefore not possible to carry out a valid test for decoding this single bit because the changing of this bit amounts to the testing of an identical memory zone.

In certain cases, the memory may even be subdivided into a larger number of squares. At present, there are page accessible memories having a size ranging between 1 kb and 16 Mb, which results in a variable number of lines for a fixed number of columns. In certain cases, the number of squares repeated is greater and results in the non-testability of the decoding of a large number of addressing bits. Furthermore, the memories most subject to non-rectangular sizes are generally organized in words, while others are even configurable according to several word sizes.

SUMMARY OF THE INVENTION

The invention improves testing of a memory by taking advantage of the word organization of the memory. The method makes it possible, first, to overcome the uncertainties of the testing as described above, and, second, to reduce the testing time.

An object of the present invention is thus to provide a method for verifying the integrity of the decoding circuits of a memory comprising a storage matrix including N rows and M columns of L-bit words. The storage matrix has N*M*L storage cells accessible by N*M addresses per L-bit word. The variables N, M and L are positive integers greater than 1. After all the words of the memory have been written with the same first word, at least N or M operations for writing second words are performed in the storage matrix in such a way that each row and each column has at least one second recorded word. The second words are different from the first words. All the words of the storage matrix are read.

The method of the present invention reduces the number of write operations and the number of address bits whose decoding is not verifiable by the size of the words when a test is made on the memory having a small number of rows. If several second words are written on the same row or in the same column, then it is useful that the second words are different. This makes it possible to reduce the risk of non-testability of the decoding of an address bit to zero.

One improvement for a memory that has a page write mode includes the fact that a plurality of different second words are written simultaneously on the same row. The second words are written on the diagonals of storage blocks, with each block having as many rows of words as it has columns of words. The use of a block write algorithm makes it possible to overcome the shape of the storage matrix.

Another object of the present invention is to provide a memory device comprising a storage matrix including N rows and M columns of L-bit words, and decoding circuits for selecting cells of the memory. The memory further comprises a test circuit for implementing the method of the invention and verifying the integrity of the decoding circuits of the memory.

BRIEF DESCRIPTION OF THE DRAWINGS

The invention will be understood more clearly and other particular features will appear from the following description, made with reference to the appended drawings, of which.

DETAILED DESCRIPTION OF THE PREFERRED EMBODIMENTS

Figure 1:
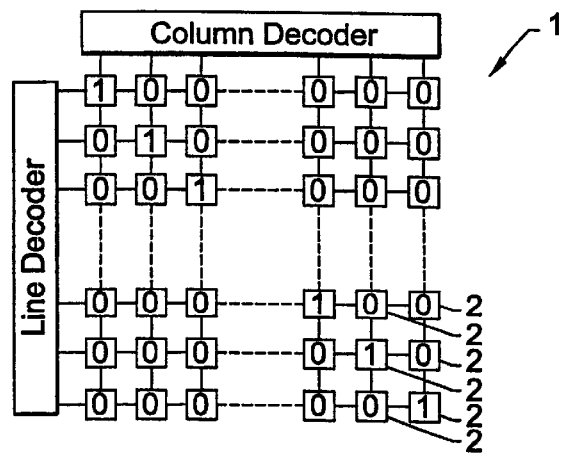
FIG. 1 shows a square memory and its contents according to the prior art.
Figure 2:
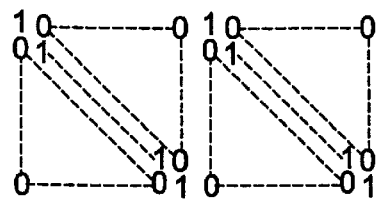
FIGS. 2 and 3 show the distribution of test data on rectangular type matrices according to the prior art.
Figure 3:
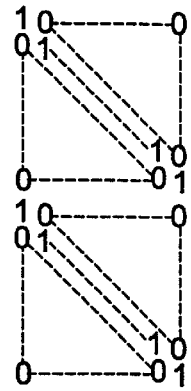
Figure 4:
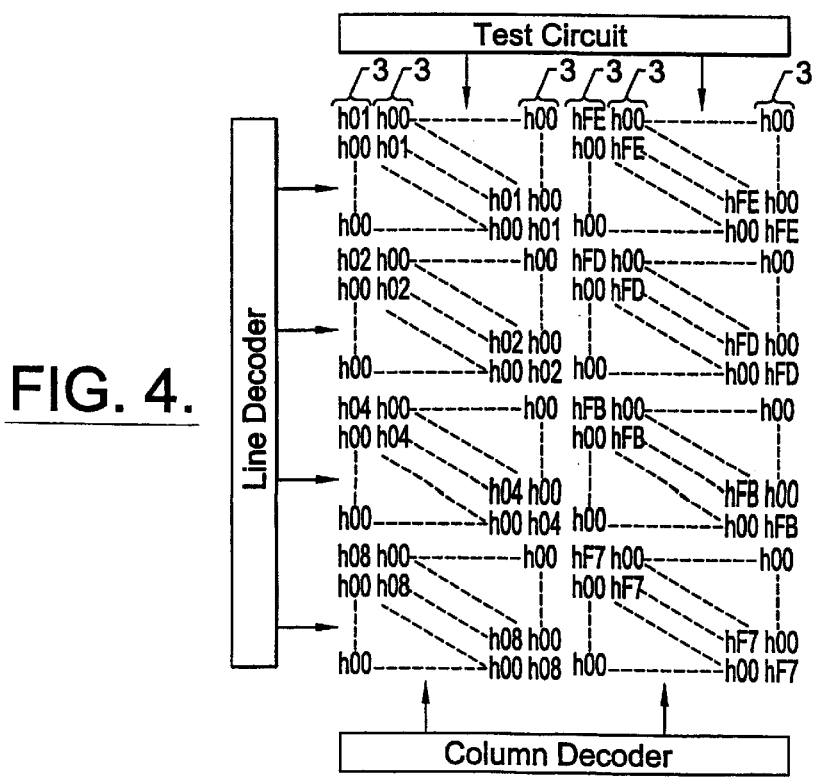
FIG. 4 shows a distribution of test data on a memory according to the present invention.

FIG. 4 shows an exemplary filling pattern according to the present invention. The columns 3 are word columns instead of bit columns. The use of word columns enables a considerable reduction in the number of write operations to be performed when the matrix has fewer rows than columns. The number of write operations is divided by the size of the words in this illustrated embodiment.

In FIG. 4, those skilled in the art understand that there are word diagonals written which may appear to be unnecessary. However, if the memory can be configured into two sizes of words, for example, 8 bits and 16 bits, this amounts to writing in 16 bits. That is, two words are written at a time with the read verification being done in 8 bits. It is also possible when using page access memories (64 eight-bit words) to carry out page write operations enabling the performance of four or eight (or possibly more) write operations simultaneously on each row. Those skilled in the art may perceive that the write operations amount to testing the memory by blocks. Each block uses a different write word. The choice of the words is not significant, but it is necessary to avoid using identical words on the same line or the same column.

Figure 5:
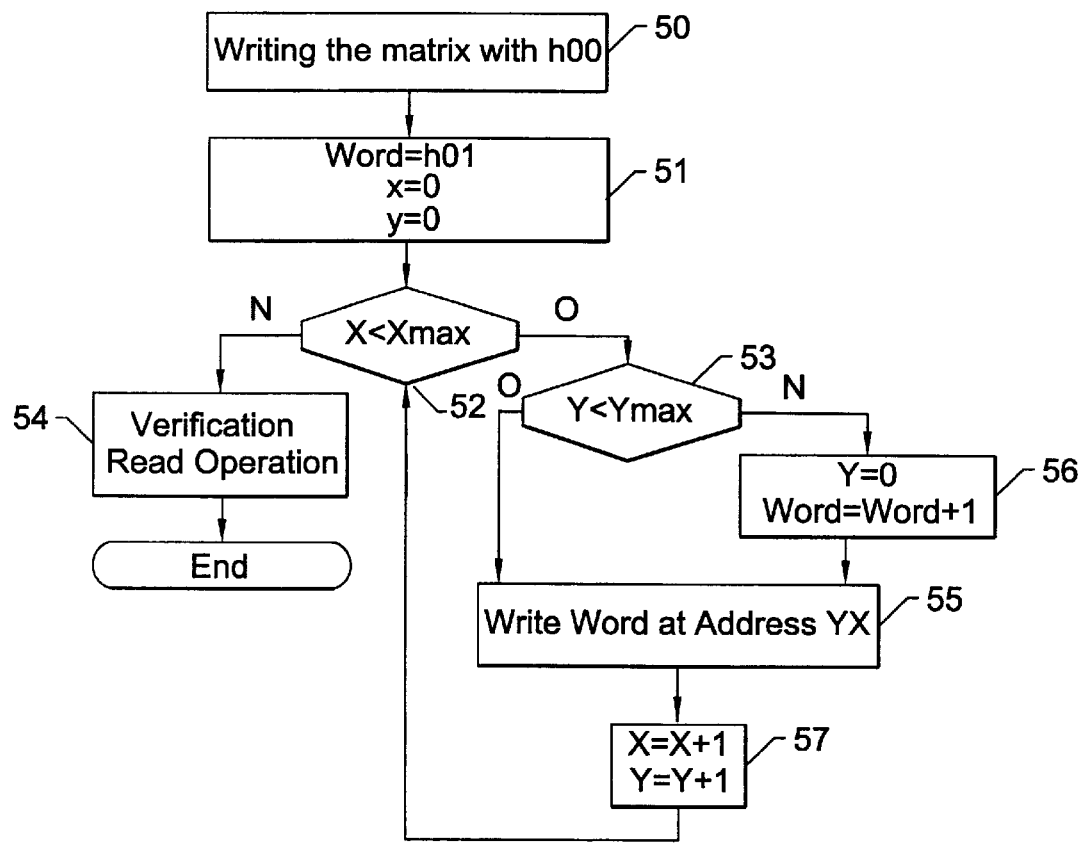
FIGS. 5 and 6 show two algorithms for performing a test according to the present invention.
Figure 6:
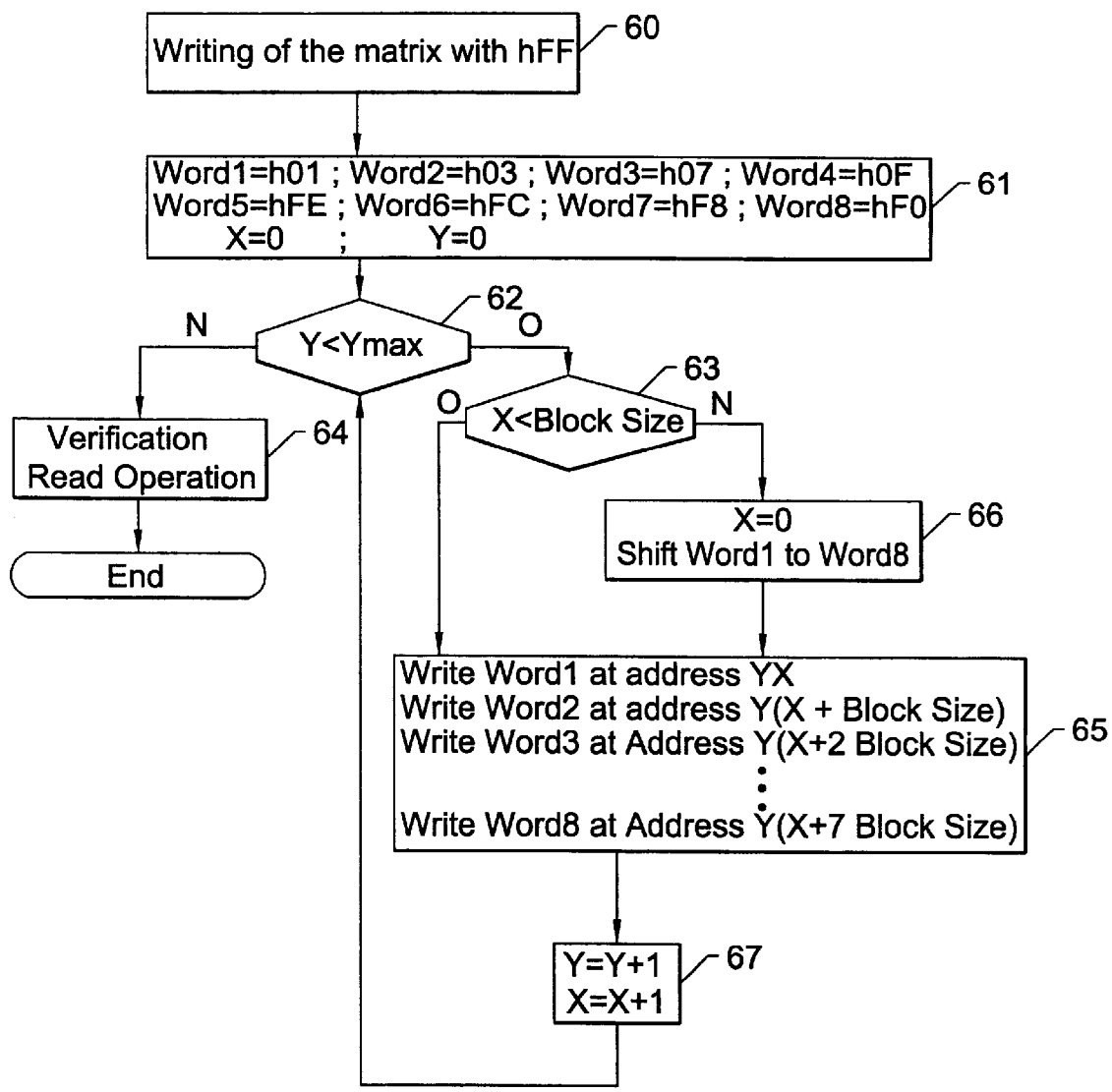

Many application algorithms are possible. FIGS. 5 and 6 show two exemplary algorithms that may be implemented according to the invention. FIG. 5 shows a straightforward application algorithm. In this algorithm, X corresponds to a word column index and Y corresponds to a word row index, for example. For the example shown in FIG. 5, it is assumed that a maximum number of word rows YMAX is smaller than a maximum number of word columns XMAX. In a first step 50, the total words of the storage matrix are written with a single word, such as the eight-bit word encoded h00. The h means that it is a word encoded in hexadecimal mode. Executing this first step 50 can be done word by word, page by page or comprehensively depending on the possibilities offered by the memory to be tested.

After the first step 50, a second step 51 is performed. During the second step 51, an eight-bit word to be written is initialized. For example, at the value h01 a word column index X is at 0 and a word row index Y is at 0. Then, the operation enters a write loop that begins with a first test 52. The first test 52 compares the column index X with the maximum number of columns XMAX. If the column index X is smaller than the maximum number of columns XMAX, then a second test 53 is performed. If the column index X is not smaller than the maximum number of columns XMAX, then a third step 54 is performed.

The second test 53 compares the row index Y with the maximum number of rows YMAX. If the row index Y is smaller than the maximum number of rows YMAX, then a fourth step 55 is performed. If the row index Y is not smaller than the maximum number of rows YMAX, then a fifth step 56 is performed before the fourth step 55. The third step 54 includes verification of the write operations in the storage matrix. This third step 54 reads all the words of the storage matrix to ascertain that the reading of the contents corresponds to what has been written. If the writing of the entire memory is accurate, then the memory is acknowledged to be valid. Otherwise, the memory is acknowledged to be non-operational. The third step 54 ends the test.

During the fourth step 55, the word to be written is written at a storage location corresponding to the current index Y word row and the current index X word column. During the fifth step 56, the row index Y is set at 0 and the word to be written is incremented by one unit. After the fourth step 55, a sixth step 57 is performed. The sixth step 57 includes updating the row indices Y and column indices X. The row indices Y and column indices X are then incremented by one unit each. At the end of this sixth step, the first step 52 is performed again.

This exemplary implementation may undergo various modifications without departing from the context of the invention. If the maximum number of rows YMAX is greater than the maximum number of columns XMAX, it is necessary to exchange the row and column indices to have a write algorithm of shorter duration. Similarly, the different digital values are arbitrary. Indeed, during the first step 50, it is quite possible to initialize the matrix with another digital value provided that this digital value is not used as a word to be written thereafter. Preferably, either the value h00 or the value hFF will be used for this first step. This allows certain memories to have a 1 setting or a 0 setting that is comprehensive for all the storage bits.

With respect to the word to be written in the example of FIG. 5, the word has been initialized at h01 and then incremented. It possible to have any other initialization value as well as to use any mode of changing a word to be written other than that of a simple incrementation. What must not be done is to write the same word twice on the same row or the same column. During a second step 51, the row and column indices are set at 0. It is possible to use another initialization, such as Y=3, for example. In this case, the square matrix diagonals do not correspond to the pattern recorded. Similarly, it is possible to increment Y by three units instead of one unit, but the pattern will no longer correspond to diagonals. Preferably, the diagonals of the square blocks of words of the storage matrix are used to simplify the processing algorithms. The square blocks of words have as many word rows as there are word columns. It is also possible to initialize the indices X and Y at the respective values XMAX and YMAX, and decrement the indices X and Y. It is also necessary to test the indices by comparing them with zero.

A memory using eight-bit words has also been shown. The invention is entirely adaptable to memories organized in words of different sizes. The algorithm of FIG. 5 may be improved. If there is a memory having an access that is configurable in at least two sizes of different words, it will be necessary to write with words of the largest size and to read the memory with words of the smallest size. In this case, it is preferable to have a word that can be separated into two distinct words. Preferably, if the memory can be configured in two sizes of words, then a word that can be separated into two complementary words is used.

The algorithm of FIG. 5 is easily implemented in a memory device by using a test circuit comprising blocks including logic gates and flip-flop circuits. Each block represents one step of the method and comprises one input connected to the preceding block to receive the result of the preceding step, and one output connected to the next block to furnish a result to the next block which corresponds to the next step.

FIG. 6 shows an application algorithm using a subdivision of the memory into blocks. This algorithm is particularly valuable when the memory has a page write mode. In this algorithm, X corresponds to a word column index and Y corresponds to a word row index, for example. For the example shown in FIG. 6, it is assumed that a maximum number of rows YMAX of words is greater than a block size. A maximum number of columns XMAX of words is a multiple of the block size, such as a coefficient eight, for example.

During a first step 60, all the words of the storage matrix are written with a single word, for example, the eight-bit word encoded hFF. This first step 60 can be run according to the different possibilities as explained for step 50. After the first step 60, a second step 61 is performed. During this second step 61, the first to eighth eight-bit words are initialized at the respective values h01, h03, h07, h0F, hFE, hFC, hF8 and hF0, for example. A word column index X is initialized at 0, and a word row index Y is initialized at 0, for example.

The operation enters a write loop which begins with a first test 62. The first test 62 compares the row index Y with the maximum number of rows YMAX. If the row index Y is smaller than the maximum number of rows YMAX, then a second test 63 is performed. If the row index Y is not smaller than the maximum number of rows YMAX, then a third step 64 is performed. The second test 63 compares the column index X with the block size. If the column index X is smaller than the block size, then a fourth step 65 is performed. If the column index X is not smaller than the block size, then a fifth step 66 is performed before the fourth step 65. The third step 64 includes verification of the write operations in the storage matrix. This third step 64 is identical to the previously described step 54. The third step 64 ends the test.

During the fourth step 65, the first to eighth words are written at the storage locations that correspond, first, to the current index Y word row. Secondly, the words are written respectively to the following: to the current index X word column, to the current index X word column with the addition of the block size, to the current index X word column with the addition of twice the block size, to the current index X word column with the addition of three times the block size, to the current index X word column with the addition of four times the block size, to the current index X word column with the addition of five times the block size, to the current index X word column with the addition of six times the block size, and to the current index X word column with the addition of seven times the block size.

If the memory has one page write mode, this amounts to performing only one page write operation. If the memory has no page write mode, then the writing of several blocks may correspond to a loss of time, especially if the maximum number of words lines YMAX is greater than the maximum number of word columns XMAX.

During the fifth step 66, the column index X is set at 0 and the first to eighth words are changed. The changing of the first to eighth words can be done in different ways, for example, by shifting each of the words by one bit. What is important in the changing of the words is to change each of the first to the eighth words in such a way that, first, the eight words are different from one another. Secondly, each of the first to eighth words have not been used previously as the first to eighth words. Preferably, a word is used no more than once in a matrix. After the fourth step 65 has been performed, a sixth step 67 is performed. The sixth step 67 includes updating the row indices Y and column indices X. The row indices Y and column indices are then incremented by one unit each. At the end of this sixth step, the first test 62 is done again.

This exemplary implementation may undergo various modifications without departing from the scope of the invention. In particular, modifications presented for the algorithm of FIG. 5 are valid for the algorithm of FIG. 6. Those skilled in the art may note that if the algorithm of FIG. 6 is performed with a block size equal to XMAX and if the operation uses only one word to be written, then we return to the algorithm of FIG. 5 having inverted word rows and word columns.

By analogy again, if there is a memory available having an access with several sizes of words and no page write mode, it is possible to perform the algorithm of FIG. 6 for taking a number of words to be written that is the ratio between the greatest word size and smallest word size. The block size flowing from the division of the number of words of minimal size are located on the same line divided by the number of words to be written. The algorithm of FIG. 6 is easily implemented in a memory device by using a test circuit including one or more blocks comprising logic gates and flip-flop circuits.

That which is claimed is:

1. A method for verifying integrity of decoding circuits of a memory comprising a matrix of storage cells defined by N rows and M columns of L-bit words, the method comprising the steps of:
    writing a first word in the L-bit words for the storage cells, the matrix having N*M*L storage cells accessible by N*M addresses per L-bit word, with N, M and L being positive integers greater than 1;
    writing at least N or M second words in the matrix of storage cells so that each row and each column has at least one stored second word, the second words being different from the first word; and
    reading all the first and second words stored in the matrix of storage cells.

2. A method according to claim 1, wherein if more than one second word is written in the same row or in the same column, then the respective second words are different from each other.

3. A method according to claim 1, wherein the steps of writing the second words and reading the first and second words are performed according to at least two word sizes; the method comprising writing the second words with a largest word size and reading the first and second words with a smallest word size.

4. A method according to claim 1, wherein the step of writing the second words is performed according to only two sizes of words; the method comprising writing the second words with a largest word size that can be separated into two words having a smallest word size that are complementary to each other.

5. A method according to claim 1, wherein the memory includes a page write mode; the method comprising simultaneously writing a plurality of second words that are different from one another when written on the same row.

6. A method according to claim 1, wherein the first word comprises a word formed by bits having the same logic state.

7. A method according to claim 6, wherein writing the first word comprises writing a logic 1 or to a logic 0 to all the storage cells.

8. A method according to claim 1, wherein the matrix of storage cells defines at least one storage block having as many word lines as word columns; the method comprising writing the second words to diagonal storage cells in the at least one storage block.

9. A method according to claim 1, wherein the step of writing at least N or M second words comprises writing N second words if N is greater than M, and writing M second words if M is greater than N.

10. A method for verifying integrity of decoding circuits of a memory comprising a matrix of storage cells, the method comprising the steps of:
   writing a first word in the storage cells;
   writing a plurality of second words in the matrix of storage cells so that each row and each column has at least one stored second word, the second words being different from the first word; and
   reading all the first and second words stored in the matrix of storage cells.

11. A method according to claim 10, wherein the matrix of storage cells is defined by N rows and M columns of L-bit words, the matrix having N*M*L storage cells accessible by N*M addresses per L-bit word, with N, M and L being positive integers greater than 1, the step of writing a plurality of second words comprises writing N second words if N is greater than M, and writing n second words if M is greater than N.

12. A method according to claim 10, wherein if more than one second word is written in the same row or in the same column, then the respective second words are different from each other.

13. A method according to claim 10, wherein the steps of writing the second words and reading the first and second words are performed according to at least two word sizes; the method comprising writing the second words with a largest word size and reading the first and second words with a smallest word size.

14. A method according to claim 10, wherein the step of writing the second words is performed according to only two sizes of words; the method comprising writing the second words with a largest word size that can be separated into two words having a smallest word size that are complementary to each other.

15. A method according to claim 10, wherein the memory includes a page write mode; the method comprising simultaneously writing a plurality of second words that are different from one another when written on the same row.

16. A method according to claim 10, wherein the first word comprises a word formed by bits having the same logic state.

17. A method according to claim 16, wherein writing the first word comprises writing a logic 1 or to a logic 0 to all the storage cells.

18. A method according to claim 10, wherein the matrix of storage cells defines at least one storage block having as many word lines as word columns; the method comprising writing the second words to diagonal storage cells in the at least one storage block.

19. A method for verifying integrity of decoding circuits of a memory comprising a matrix of storage cells defined by N rows and M columns of L-bit words, the method comprising the steps of:
   writing a first word in the L-bit words for the storage cells, the matrix having N*M*L storage cells accessible by N*M addresses per L-bit word, with N, M and L being positive integers greater than 1;
   writing N second words if N is greater than M or writing M second words if M is greater than N in the matrix of storage cells so that each row and each column has at least one stored second word, the matrix of storage cells defining at least one storage block having as many word lines as word columns such that the N or M second words are written to diagonal storage cells in the at least one storage block, the second words being different from the first word; and
   reading all the first and second words stored in the matrix of storage cells.

20. A method according to claim 19, wherein if more than one second word is written in the same row or in the same column, then the respective second words are different from each other.

21. A method according to claim 19, wherein the steps of writing the second words and reading the first and second words are performed according to at least two word sizes; the method comprising writing the second words with a largest word size and reading the first and second words with a smallest word size.

22. A method according to claim 19, wherein the step of writing the second words is performed according to only two sizes of words; the method comprising writing the second words with a largest word size that can be separated into two words having a smallest word size that are complementary to each other.

23. A method according to claim 19, wherein the memory includes a page write mode; the method comprising simultaneously writing a plurality of second words that are different from one another when written on the same row.

24. A method according to claim 19, wherein the first word comprises a word formed by bits having the same logic state.

25. A method according to claim 24, wherein writing the first word comprises writing a logic 1 or to a logic 0 to all the storage cells.

26. A memory device comprising:
   a matrix of storage cells defined by N rows and M columns of L-bit words;
   a decoder circuit for selecting storage cells in said matrix; and
   a test circuit for verifying integrity of said decoder circuit by the steps of:
      writing a first word in the storage cells,
      writing a plurality of second words in said matrix of storage cells so that each row and each column has at least one stored second word, the second words being different from the first word, and
      reading all the first and second words stored in said matrix of storage cells.

27. A memory device according to claim 26, wherein said matrix of storage cells is defined by N rows and M columns of L-bit words, said matrix having N*M*L storage cells accessible by N*M addresses per L-bit word, with N, M and L being positive integers greater than 1, the step of writing a plurality of second words comprises writing N second words if N is greater than M, and writing M second words if M is greater than N.

28. A memory device according to claim 26, wherein if more than one second word is written in the same row or in the same column, then the respective second words are different from each other.

29. A memory device according to claim 26, wherein the steps of writing the second words and reading the first and second words are performed according to at least two word sizes; said test circuit writing the second words with a largest word size and reading the first and second words with a smallest word size.

30. A memory device according to claim 26, wherein the step of writing the second words is performed according to only two sizes of words; said test circuit writing the second words with a largest word size that can be separated into two words having a smallest word size that are complementary to each other.

31. A memory device according to claim 26, wherein said memory includes a page write mode; said text circuit simultaneously writing a plurality of second words that are different from one another when written on the same row.

32. A memory device according to claim 26, wherein the first word comprises a word formed by bits having the same logic state.

33. A memory device according to claim 32, wherein writing the first word comprises writing a logic 1 or to a logic 0 to all the storage cells.

34. A memory device according to claim 26, wherein said matrix of storage cells defines at least one storage block having as many word lines as word columns; said test circuit comprising writing the second words to diagonal storage cells in the at least one storage block.

* * * * *

UNITED STATES PATENT AND TRADEMARK OFFICE
CERTIFICATE OF CORRECTION

PATENT NO. : 6,212,112 B1
DATED : April 3, 2001
INVENTOR(S) : David Naura, Frederic Moncada It is certified that error appears in the above-identified patent and that said Letters Patent is hereby corrected as shown below:

<u>Column 7,</u>
Line 22, delete "n second" insert -- M second --

Signed and Sealed this

Thirtieth Day of October, 2001

Attest:

NICHOLAS P. GODICI
*Attesting Officer*    *Acting Director of the United States Patent and Trademark Office*